(12) United States Patent
Inoue et al.

(10) Patent No.: US 8,937,256 B2
(45) Date of Patent: Jan. 20, 2015

(54) METHOD FOR MANUFACTURING WIRING BOARD FOR MOUNTING ELECTRONIC COMPONENT, WIRING BOARD FOR MOUNTING ELECTRONIC COMPONENT, AND METHOD FOR MANUFACTURING WIRING BOARD HAVING AN ELECTRONIC COMPONENT

(75) Inventors: Masahiro Inoue, Konan (JP); Hajime Saiki, Konan (JP); Atsuhiko Sugimoto, Kagamigahara (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 235 days.

(21) Appl. No.: 13/353,965

(22) Filed: Jan. 19, 2012

(65) Prior Publication Data
US 2012/0186857 A1    Jul. 26, 2012

(30) Foreign Application Priority Data

Jan. 21, 2011  (JP) .................................. 2011-011293

(51) Int. Cl.
*H01K 1/02*    (2006.01)
*H05K 13/04*    (2006.01)
(Continued)

(52) U.S. Cl.
CPC .............. *H05K 3/3478* (2013.01); *H01L 24/81* (2013.01); *H05K 3/3436* (2013.01); *H05K 2201/10977* (2013.01); *H01L 2224/16225* (2013.01)
USPC ........................ 174/260; 174/251; 228/180.22

(58) Field of Classification Search
CPC .................................. H05K 1/02; H05K 13/04
USPC ...................... 174/251, 260; 228/199, 180.22
See application file for complete search history.

(56) References Cited

U.S. PATENT DOCUMENTS 6,461,953 B1  10/2002  Sakuyama
7,183,985 B2 *  2/2007  Tseng ........................... 343/702
(Continued)

FOREIGN PATENT DOCUMENTS

JP    2004-2792 A    1/2004
JP    2007-227654 A    9/2007
(Continued)

OTHER PUBLICATIONS

Japanese Patent Office, Notification of Reason for Refusal issued in corresponding Japanese application 2011-011293, dispatched Feb. 4, 2014.

*Primary Examiner* — Timothy Thompson
*Assistant Examiner* — Charles Pizzuto
(74) *Attorney, Agent, or Firm* — Stites & Harbison PLLC; Jeffrey A. Haeberlin; James R. Hayne

(57) ABSTRACT

A method for manufacturing a wiring board for mounting an electronic component, a wiring board for mounting an electronic component, and a method for manufacturing an electronic-component-mounted wiring board are provided. A bonding material paste, which can include solder and an electric insulation material made of a resin, can be placed on chip mount terminal pads and heated to fuse the solder and soften the electric insulation material. Subsequently, the solder is solidified to form solder bumps. Further, the electric insulation material is cured on a surface of each of the solder bumps and a surface of a multilayer board around each of the solder bumps to form an electric insulation surface layer. Accordingly, when a chip is mounted to such wiring boards, the electric insulation surface layer minimizes or eliminates the connection between adjacent solder bumps during refusing of the solder.

4 Claims, 13 Drawing Sheets

(51) Int. Cl.
*H05K 3/34* (2006.01)
*H01L 23/00* (2006.01)

(56) References Cited

U.S. PATENT DOCUMENTS

| | | | |
|---|---|---|---|
| 7,611,040 B2 | 11/2009 | Kitae et al. | |
| 7,726,545 B2 | 6/2010 | Ichiryu et al. | |
| 7,951,700 B2 | 5/2011 | Kitae et al. | |
| 8,283,246 B2 | 10/2012 | Kitae et al. | |
| 8,450,859 B2 | 5/2013 | Ohashi et al. | |
| 8,499,441 B2* | 8/2013 | Park et al. | 29/842 |
| 2008/0101045 A1* | 5/2008 | Jung et al. | 361/761 |
| 2008/0165518 A1 | 7/2008 | Ichiryu et al. | |
| 2008/0197173 A1 | 8/2008 | Kitae et al. | |
| 2009/0023245 A1 | 1/2009 | Kitae et al. | |
| 2009/0315179 A1* | 12/2009 | Shigihara et al. | 257/737 |
| 2010/0307808 A1* | 12/2010 | Horiuchi et al. | 174/264 |
| 2011/0095423 A1 | 4/2011 | Ohashi et al. | |
| 2011/0201195 A1 | 8/2011 | Kitae et al. | |

FOREIGN PATENT DOCUMENTS

| | | | |
|---|---|---|---|
| JP | 2008-182279 A | | 8/2008 |
| JP | 2010-161419 A | | 7/2010 |
| JP | 2010161419 A | * | 7/2010 |
| WO | 2006/098268 A1 | | 9/2006 |
| WO | 2006/109407 A1 | | 10/2006 |
| WO | 2006/126361 A1 | | 11/2006 |
| WO | 2010/050185 A1 | | 5/2010 |

* cited by examiner

METHOD FOR MANUFACTURING WIRING BOARD FOR MOUNTING ELECTRONIC COMPONENT, WIRING BOARD FOR MOUNTING ELECTRONIC COMPONENT, AND METHOD FOR MANUFACTURING WIRING BOARD HAVING AN ELECTRONIC COMPONENT

CROSS REFERENCE TO RELATED APPLICATIONS

The present application claims priority from Japanese Patent Application No. 2011-011293, which was filed on Jan. 21, 2011, the disclosure of which is herein incorporated by reference in its entirety.

BACKGROUND OF THE INVENTION

1. Field of the Invention

The present invention relates to a wiring board for mounting an electronic component on which an electronic component is to be mounted by means of solder bumps formed on respective terminal pads of a multilayer board. The present invention further relates to a method for manufacturing the electronic component mount wiring board and a method for manufacturing a wiring board having an electronic component.

2. Description of Related Art

A method for bonding pads formed on a wiring board to pads formed on an electronic component by utilization of solder has been widely known as a method for mounting electronic components, such as a semiconductor element (e.g., IC chip), on a wiring board, such as a semiconductor package.

For instance, a technique known as a flip-chip technique includes: forming solder bumps on pads (terminal pads) of a semiconductor package, forming solder bumps on pads (element pads) of an IC chip, and bonding the solder bumps together to thus mount the IC chip on the semiconductor package. See JP-A-2007-227654, for example.

A method for using a bonding material including solder particles mixed in a thermosetting resin has recently been known as a method for mounting an IC chip in a semiconductor package by means of solder bonding.

Under the method, a bonding material has been previously fed to terminal pads of a semiconductor package prior to mounting of an IC chip having solder bumps. The semiconductor package is heated after mounting the IC chip, thereby fusing and solidifying solder particles in the bonding material to form solder junctions. The thermosetting resin is softened and hardened, to thus form a resin layer. Terminal pads of the semiconductor package and solder bumps of the IC chip are thereby brought into electrical conduction with each other by means of solder bonding, whereby the solder junctions are covered with and reinforced by the cured thermosetting resin. See JP-A-2010-161419, for example.

BRIEF SUMMARY OF THE INVENTION

As mentioned previously, when solder bumps of a semiconductor package are bonded to and electrically connected to solder bumps of an IC chip, the semiconductor package and the IC chip are connected by means of re-fusing solder of the solder bumps of the semiconductor package. When a volume of solder of a solder bump P1 is large, as shown in FIG. 12A, or when a minute deviation exists in a bump pitch, a spacing between solder bumps, between a semiconductor package P2 and an IC chip P3, as shown in FIG. 12B, there is a problem of adjacent solder bumps coming into connection with each other.

In particular, when a demand for precise wiring and a tendency toward smaller bump pitch exist, as seen in recent years, there will arise a problem of adjacent solder bumps being apt to connect to each other.

The present invention has been conceived in light of the problems and aims at providing a method for manufacturing an electronic component mount wiring board that can prevent connection of adjacent solder bumps when an electronic component and a wiring board are connected together by means of re-fusing of solder, an electronic component mount wiring board, and a method for manufacturing an electronic-component-mounted wiring board.

(1) In one embodiment, the present invention provides a method for manufacturing a wiring board for mounting an electronic component by means of solder bumps formed on respective terminal pads of a multilayer board, which includes a conductor layer and a resin insulation layer layered one on top of the other, the method comprising:

putting on each of the terminal pads a bonding material that includes solder and an electric insulation material made of a resin;

heating the bonding material to fuse the solder and soften the electric insulation material;

solidifying the solder to form the solder bumps; and curing the electric insulation material on a surface of each of the solder bumps and a surface of the multilayer board located around each of the solder bumps to form an electric insulation surface layer.

In embodiments of the present invention, a bonding material including solder and an electric insulation material made of a resin is put on each of the terminal pads, and the bonding material is heated, thereby fusing the solder and softening the electric insulation material. Subsequently, the solder is solidified, to thus form solder bumps, and the electric insulation material is cured on a surface of each of the solder bumps and a surface of the multilayer board around each of the solder bumps, to thus form the electric insulation surface layer.

Specifically, in the present invention, the electric insulation surface layer is formed around each of the solder bumps. Hence, if solder is fused (re-fused) when an electronic component, such as a semiconductor package, is mounted on the electronic component mount wiring board having the thus-structured solder bumps, an advantage is yielded in that the electric insulation surface layer formed around each of the solder bumps poses a difficulty for the generation of connections between the adjacent solder bumps. In particular, when the volume of solder is large and when a pad pitch is small, a connection is likely to occur between the solder bumps. However, the present invention yields the superior and unexpected advantage of minimizing or preventing, in a preferable manner, the occurrence of connections between solder bumps, even in such cases.

Although the electric insulation surface layer is formed around each of the solder bumps, it is preferable to primarily form the electric insulation surface layer so as to cover a lower side (a wiring board side) of each of the solder bumps and not to reach an upper portion of the solder bump. The reason for this is that the upper portion of each of the solder bumps is bonded and electrically connected to a corresponding terminal of an electronic component to be mounted.

A proposed electric insulation material is one that forms an electric insulation surface layer which either softens or does not soften when solder becomes fused or re-fused during mounting of an electronic component. Even in the case where the electric insulation material that forms an electric insulation surface layer becomes softened, the respective solder bumps are integrated, for instance, by means of surface tension of the solder bumps themselves, and the electric insulation material exists around the respective solder bumps. Another advantage of the configuration is that the solder bumps are prevented from contacting each other.

A coreless board from which a core board is omitted can be adopted as the multilayer board.

The electronic components include a semiconductor element (e.g., an IC chip), a capacitor, an inductor, a filter, a resistor, and the like.

Copper, a copper alloy, nickel, a nickel alloy, tin, a tin alloy, and the like can be adopted as a material used for forming the conductor layer and the terminal pads. The conductor layer and the terminal pads can be formed by means of any known technique, like a subtractive technique, a semi-additive technique, a full-additive technique, and the like. For instance, a copper etching technique, an electroless copper plating technique, or an electrolytic copper plating may be applied to form the conductor layer and the terminal pads. Further, a conductor layer and terminal pads can also be formed by forming a thin film by means of a sputtering technique, a CVD technique, or the like, and etching the thus-formed thin film. Alternatively, a conductor layer and terminal pads can also be formed by means of printing a conductive paste, or the like.

The resin insulation layer can be selected, as required, in consideration of insulation characteristics, heat resistance, humidity resistance, and the like. A preferred examples of a polymeric material used for forming the resin insulation layer includes thermosetting resins, such as an epoxy resin, a phenolic resin, an urethane resin, a silicone resin, and a polyimide resin, thermoplastic resins, such as a polycarbonate resin, an acrylic resin, a polyacetal resin, a polypropylene resin, and the like. In addition, there can also be employed a composite material made up of resins, glass fibers (e.g., a glass woven fabric and a glass unwoven fabric) and organic fibers such as polyamide fibers, resin-resin composite materials prepared by causing a three-dimensional reticulated fluorine-based resin base material, such as continuous porous PTFE, to impregnate a thermosetting resin, like an epoxy resin, and the like.

A material for solder included in the bonding material includes Pb—Sn-based solder like 90Pb-10Sn, 95Pb-5Sn, and 40Pb-60Sn, Sn—Bi-based solder, Sn—Sb-based solder, Sn—Ag-based solder, Sn—Ag—Cu-based solder, Au—Ge-based solder, Au—Sn-based solder, and the like.

A thermosetting resin is mentioned as the electric insulation material included in the bonding material. An epoxy resin can preferably be used as the thermosetting resin. Types of epoxy resin that can be adopted include bisphenol A types, bisphenol F types, multifunctional types, alicyclic types, biphenyl types, and the like. In addition to the epoxy resin, an acrylic resin, an oxetane resin, a polyimide resin, an isocyanate resin, and the like, can also be used as the thermosetting resin.

(2) Further embodiments of the present invention provide a method for manufacturing a wiring board for mounting an electronic component according to (1), wherein the bonding material is a paste, and the bonding material after the solidifying step includes 50 percent by weight to 95 percent by weight of the solder and 5 percent by weight to 50 percent by weight of the electric insulation material, and more preferably may include 80 percent by weight to 90 percent by weight of the solder and 10 percent by weight to 20 percent by weight of the electric insulation material.

By means of the configuration, there can be formed a structure that easily covers a surrounding area of each of solder bumps with an electric insulation material.

A paste-like bonding material formed with a resin, like a thermosetting resin, and solder (e.g., solder particles or the like) can be adopted as the bonding material. In addition to including the resin and the solder, the bonding material can also include various other components. For instance, when a thermosetting resin is used as a resin, there can be adopted a bonding material including, in addition to a thermosetting resin and solder, an agent for curing the thermosetting resin, an activator that imparts active action for eliminating an oxide film from solder, a thixo agent for controlling thixotropy of the paste, and other additives. Loadings of the additives are appropriately controlled according to a solder content in the bonding material, a particle size of solder, and a degree of progress in oxidation of an object to be bonded.

An epoxy resin can preferably be used as the thermosetting resin, as mentioned above. Types of epoxy resin include bisphenol A types, bisphenol F types, multifunctional types, alicyclic types, biphenyl types, and the like.

In relation to the curing agent, a curing agent of a type that conforms to the thermosetting resin used may be selected. In the case of an epoxy resin, imidazoles, acid anhydrides, amines, hydrazides, microcapsule-type, and the like can be selected as curing agents. Activators used in common cream solder, such as inorganic halides, amines, and organic acids, can be used as the activators. Inorganic fine powders commonly used in adhesives for electronic materials are formulated as the thixo agent.

In addition, if necessary, a silane coupling agent, an organic solvent, a flexible material, a pigment, a catalyst, and the like, will be added as an additive. The silane coupling agent is formulated with a view toward enhancing adhesion, and the organic solvent is used for controlling viscosity of the bonding material.

(3) Still further embodiments of the present invention provide a method for manufacturing a wiring board for mounting an electronic component according to (1), wherein the electric insulation material is formed from a thermosetting resin, and a glass transition temperature of the thermosetting resin is a fusing point of the solder or less.

The thermosetting resin can thereby be softened before solder is fused by heating. Consequently, solder is fused in the softened thermosetting resin, thereby forming the solder bumps. Further, an electric insulation surface layer can preferably be formed around each of the solder bumps.

The epoxy resin is preferable as the thermosetting resin. In addition to the epoxy resin, an acrylic resin, an oxetane resin, a polyimide resin, and an isocyanate resin, and the like, can be adopted.

A glass transition temperature may fall within a range from 80 degrees centigrade to 220 degrees centigrade, and a fusing point of solder may fall within a range from 120 degrees centigrade to 230 degrees centigrade.

(4) Still further embodiments of the present invention provide a wiring board for mounting an electronic component, comprising:

a multilayer board made up of a conductor layer and a resin insulation layer layered one on top of the other;

terminal pads formed on the multilayer board; and solder bumps formed on the terminal pads; wherein the electronic component is mounted by means of the solder bumps, and an electric insulation surface layer made of an electric insulation material is formed on each of the solder bumps from a surface of the solder bumps to a surface of the multilayer board located around the solder bumps.

In embodiments of the present invention, the electric insulation surface layer is formed around each of the solder bumps. Hence, when solder is fused to mount an electronic component, such as a semiconductor package on an electronic component mount wiring board having solder bumps having such a structure, there is yielded a superior and unexpected advantage of the electric insulation surface layer formed around each of the solder bumps that reduces or eliminates the occurrence of connections between adjacent solder bumps. In particular, when the volume of solder is large or when a pad pitch is small, the solder bumps are likely to connect to each other. However, even in such a case, embodiments of the present invention yield the advantage of preventing, in a preferable manner, the occurrence of a connection between the solder bumps.

(5) Still further embodiments of the present invention provide a method for manufacturing an electronic-component-mounted wiring board from the wiring board for mounting an electronic component of (4), the method comprising:

heating the solder bumps while terminals of the electronic component are held in contact with or in close proximity to the solder bumps to fuse the solder bumps; and cooling the solder bumps to solidify and bond the solder bumps to the terminals of the electronic component, thereby mounting the electronic component to the wiring board for mounting an electronic component.

In embodiments of the present invention, the solder bumps, whose surrounding areas are covered with the electric insulation layer, on the electronic component mount wiring board are heated while terminals of the electronic component remain in contact with or in close proximity to the solder bumps. The solder bumps are thereby fused, whereupon the thus-fused solder is bonded to the terminals of the electronic component. On the occasion of fusing of solder, the electric insulation surface layer exists around each of the solder bumps, thereby preventing occurrence of a connection between adjacent solder bumps.

Terminal pads of an electronic component or solder bumps formed on the respective terminal pads may refer to the terminals of the electronic component.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

An embodiment to which the present invention applies is hereunder described by reference to the drawings.

Embodiment

Explanations are hereunder provided of as examples, an electronic component mount wiring board in which an IC chip, or the like, is to be mounted on one principal surface of a coreless board and an electronic-component-mounted wiring board in which an IC chip, or the like, is mounted on the board.

A configuration of the electronic component mount wiring board and a configuration of the electronic-component-mounted wiring board of the present embodiment are now described by reference to FIGS. 1 through 3.

Figure 1A:
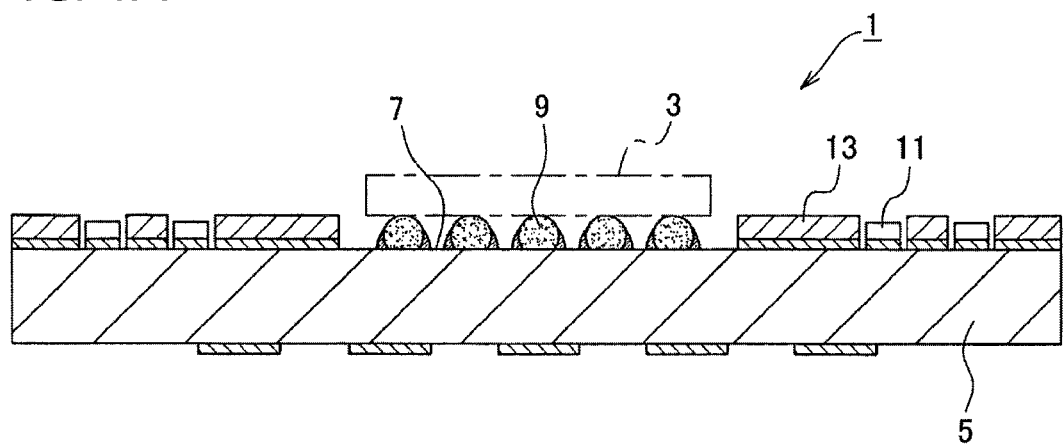
FIG. 1A is a cross sectional view showing a rough structure of an embodied electronic component mount wiring board while the board is broken in its thicknesswise direction.

As shown in FIG. 1A, an electronic component mount wiring board 1 of the embodiment (hereinafter "mount wiring board") is a semiconductor package for mounting an IC chip 3. The mount wiring board 1 principally includes a coreless board (e.g., a multilayer board) 5 formed without including a core board.

A plurality of solder bumps 9 are formed within a mount region 7 where the IC chip 3 (see FIG. 2A) is to be mounted on one principal side (e.i., a first principal surface represented by the upper side in FIG. 1) of the multilayer board 5; namely, a side on which the IC chip 3 is to be mounted. A plurality of chip capacitors 11 (CP) are mounted around the mount region 7, and a reinforcing plate 13 (stiffener) for correcting warpage in the multilayer board 5 is bonded to a surrounding area of the mount region 7.

Figure 1B:
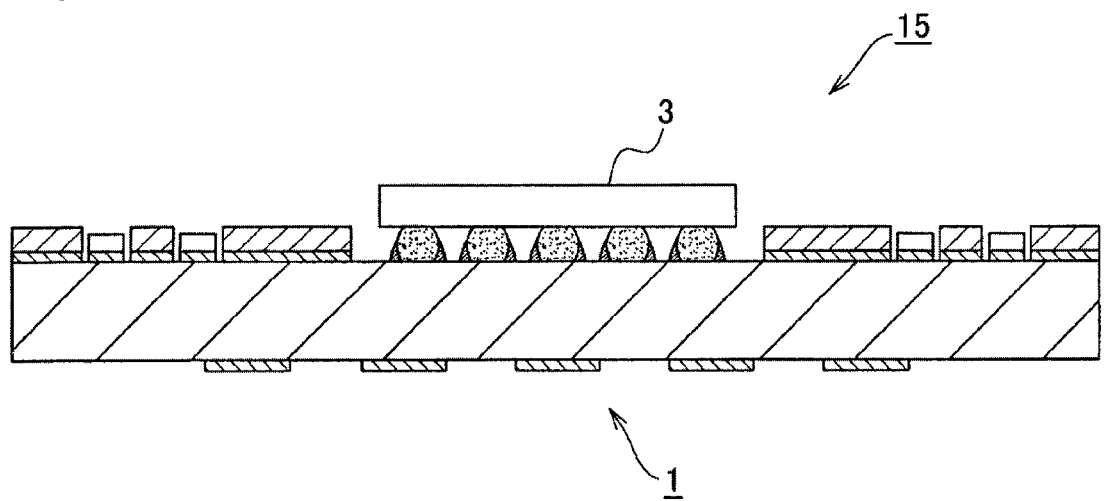
FIG. 1B is a cross sectional view showing a rough structure of an embodied electronic-component-mounted wiring board while the board is broken in its thicknesswise direction.

As shown in FIG. 1B, the mount wiring board 1 on which the IC chip 3 is mounted is referred to as an electronic-component mounted wiring board 15. Respective structure portions of the wiring board are hereunder described in detail.

Figure 2A:
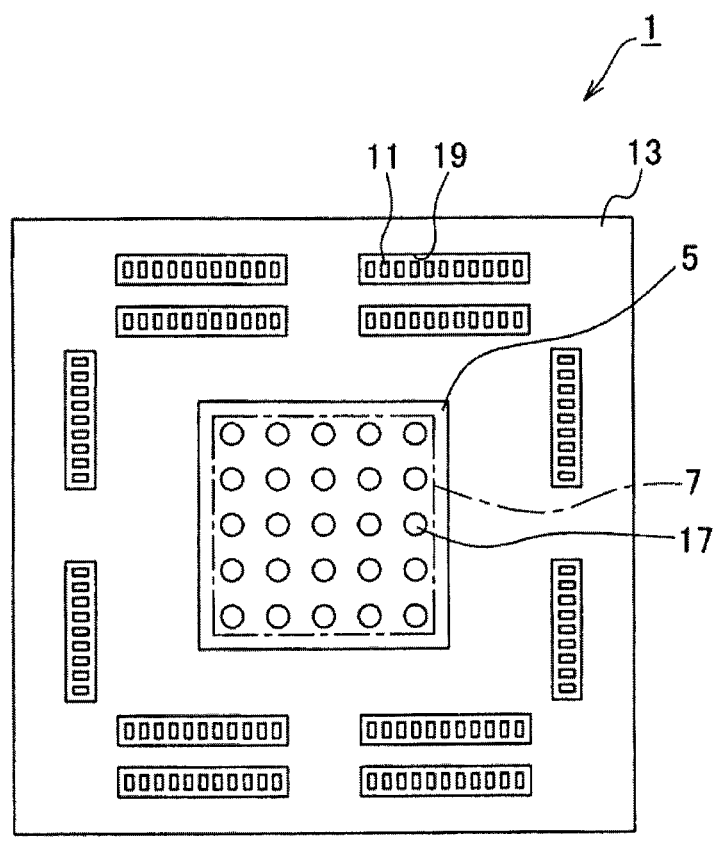
FIG. 2A is a plan view showing a first principal surface of an embodied electronic component mount wiring board.

As shown in FIG. 2A, the substantially-square mount region 7 is provided on the first principal surface side of the multilayer board 5. A plurality of chip mount terminal pads 17, on which the solder bumps 9 to be used for bonding the IC chip 3 to the multilayer board 5, are formed in the form of an array within the mount region 7.

The plurality of chip capacitors 11 are mounted on the first principal surface along respective sides of the surrounding area of the mount region 7. Further, the stiffener 13 is bonded on the first principal surface side so as to cover an area of the first principal surface other than the mount region 7 for the IC chip 3 and rectangular mount regions 19 for mounting the chip capacitors 11.

Figure 2B:
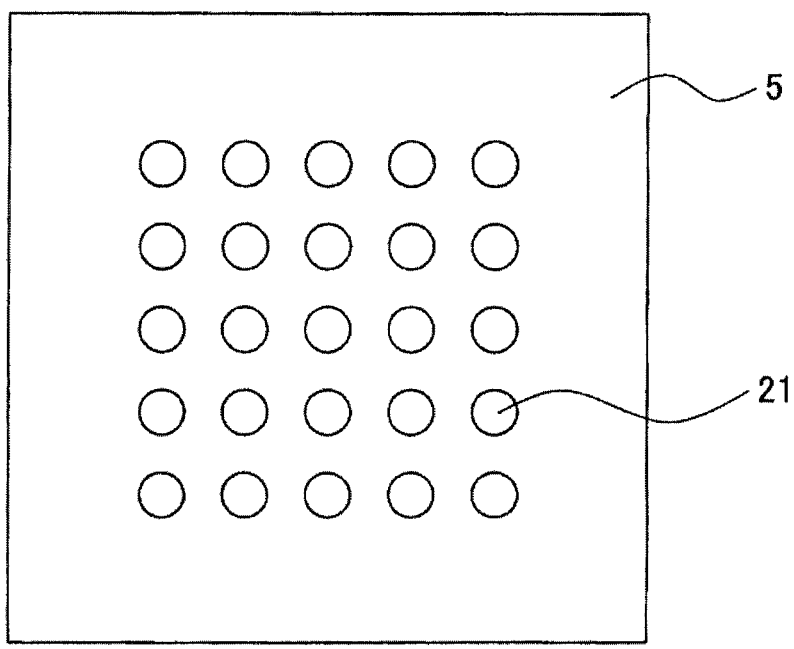
FIG. 2B is a plan view showing a second principal surface of an embodied electronic component mount wiring board.

In the meantime, as shown in FIG. 2B, a plurality of mother board terminal pads 21, on each of which a land grid array (LGA) used for bonding an unillustrated mother board (e.g. a base board) is to be formed, are formed in an arrayed pattern on a back side (second principal side) of the multilayer board 5.

Figure 3A:
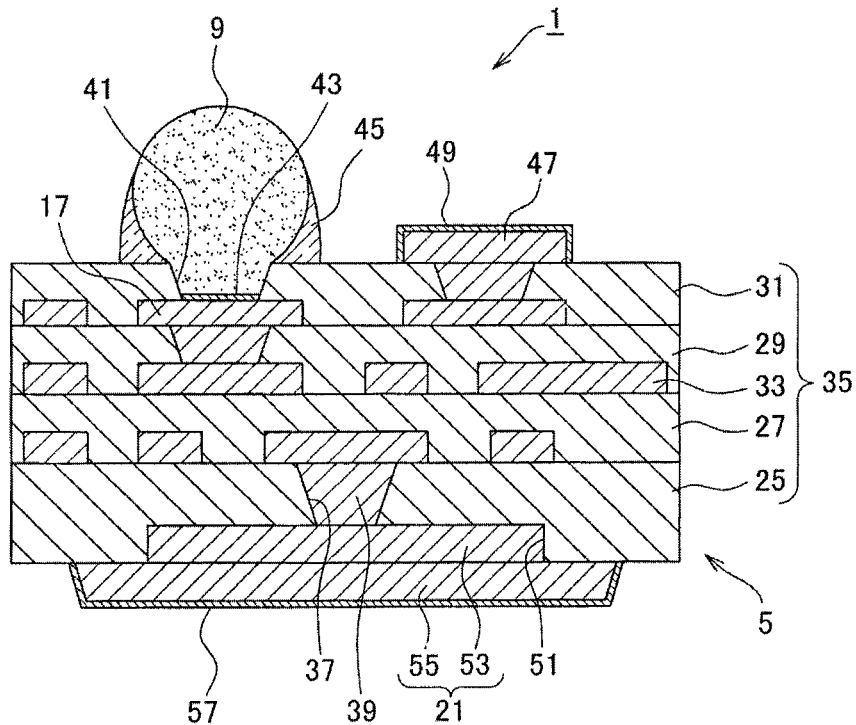
FIG. 3A is an enlarged cross sectional view showing a portion of a longitudinal cross section of an embodied multilayer board from a cross section perpendicular to the principal surface.

As shown in the partially enlarged mount wiring board 1 in FIG. 3A, the multilayer board 5 has a wire layered block 35 in which a plurality of (e.g., four) resin insulation layers 25, 27, 29, and 31, which primarily include the same resin insulation material (e.g., an electrically insulating material) and a conductor layer 33 made of copper, are layered one on top of the other.

The resin insulation layers 25, 27, 29, and 31 are formed from a resin insulation material not imparted with a photo-curing characteristic; specifically, a build-up material that includes as a main body a cured body of thermosetting epoxy resin.

Each of the resin insulation layers 25, 27, 29, and 31 is provided with a via hole 37 and a via conductor 39. The via conductor 39 has a tapered shape whose first primary surface side has a larger diameter and electrically interconnects the conductor layer 33, the chip mount terminal pad 17, and the mother board terminal pad 21.

A plurality of surface openings 41 are formed in the outermost resin insulation layer 31 on the first principal surface side of the wire layered block 35. The chip mount terminal pad 17 is formed within each of the surface openings 41 so as to become lower than an exterior surface of the resin insulation layer 31. The chip mount terminal pad 17 has such a structure as to cover only an upper surface of a principal copper layer with a plating layer 43 (e.g., nickel-gold plating) other than copper.

As shown in FIG. 3A, the substantially-spherical solder bump 9 that buries the corresponding surface opening 41, to thus upwardly jut, is formed on each of the chip mount terminal pads 17.

Figure 3B:
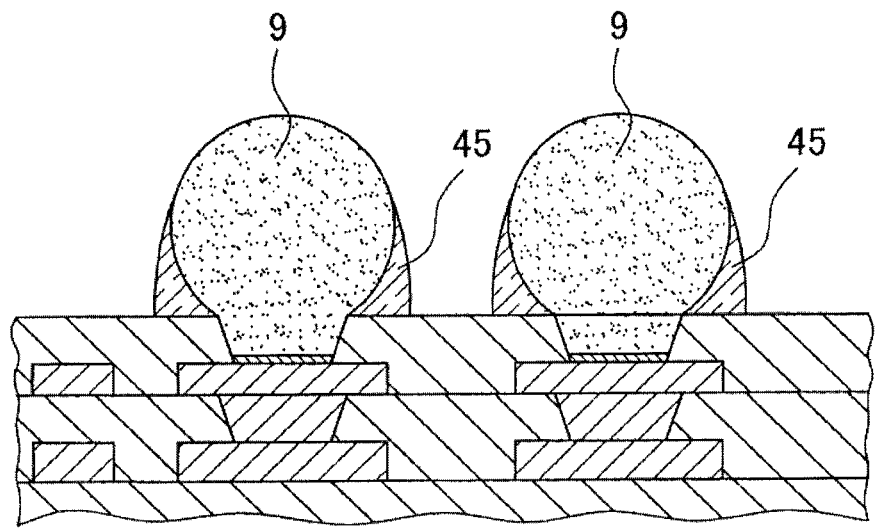
FIG. 3B is a cross sectional view showing a neighborhood of a solder bump in an enlarged manner.

Particularly, in the present embodiment, an electric insulation surface layer 45 is formed so as to cover an area ranging from a surface of a lower half of the solder bump 9 to a surface of the wire layered block 35 around the solder bump 9, in such a way that a substantial portion of the solder bump 9 is shown in an enlarged way in FIG. 3B. The electric insulation surface layer 45 is a layer made of a thermosetting resin (e.g., an epoxy resin) that is an electrical insulation material.

Specifically, the lower half of each of the solder bumps 9 is covered with the electrical insulation surface layer 45. The electric insulation surface layers 45 which cover the respective solder bumps 9 are arranged at predetermined intervals such that the solder bumps will not be connected to each other even when the solder is re-fused.

A material whose glass transition temperature is a fusing point of solder or less is used as a thermosetting resin. There is used, for instance, a material whose glass transition temperature ranges from 80 degrees centigrade to 220 degrees centigrade and assumes, for instance, 95 degrees centigrade.

Further, there can be employed a solder whose fusing temperature ranges from 120 degrees centigrade to 230 degrees centigrade and assumes, for instance, a Sn—Bi based solder whose glass transition temperature is 139 degrees centigrade. After having become softened, the thermosetting resin is cured. Even when the thus-cured thermosetting resin comes to a temperature at which solder is to become fused again, the thermosetting resin will not soften again.

Turning back to FIG. 3A, capacitor terminal pads 47 to which the chip capacitor 11 is to be bonded are formed on the first principal surface of the multilayer board 5. The capacitor terminal pads 47 are primarily formed from a copper layer. Each of the capacitor terminal pads 47 assumes a structure in which an upper surface and a side surface of the copper layer that is the primary subject are covered with a plating layer 49 (e.g., nickel-gold plating) other than copper.

In the mean time, a plurality of back openings 51 are formed in the outermost resin insulation layer 25 on a lower surface side (the second plain surface) of the wire layered block 35. Further, the mother board terminal pads 21 are arranged in correspondence with the respective back openings 51. Specifically, each of the mother board terminal pads 21 has a two-stage structure made up of a lower metal conductor portion 53 situated in the back opening 51 and an upper metal conductor portion 55 covering the lower metal conductor portion 53 and its surrounding area. Each of the mother board terminal pads 21 has a structure in which an upper surface and a side surface of the principal copper layer are covered with a plating layer 57 (e.g., nickel-gold plating) other than copper.

Process for Manufacturing a Multilayer Board

The method for manufacturing the mount wiring board 1 of the embodiment is now described by reference to FIGS. 4 through 8.

A support board, such as a glass epoxy board or the like, having sufficient strength is first prepared, and the resin insulation layers 25, 27, 29, and 31 and the conductor layer 33 are built up on a support board 65, thereby forming the wire layered block 35.

Figure 4A:
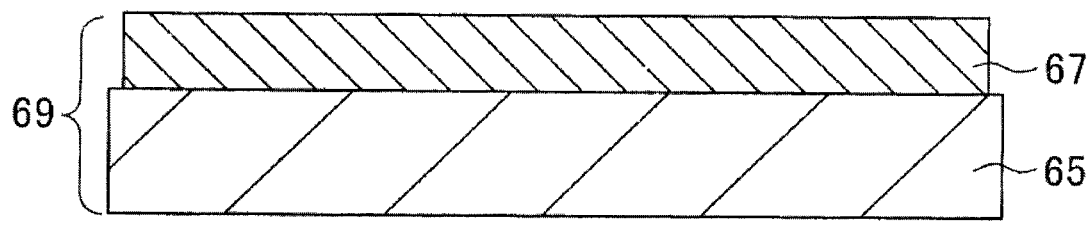
FIGS. 4A, 4B, 4C, 4D, and 4E are explanatory views showing procedures of a method for manufacturing an embodied electronic component mount wiring board while respective members are broken in their thickness direction.

Specifically, as shown in FIG. 4A, a sheet-like insulation resin base material made of epoxy resin is affixed onto the support board 65, thereby forming a base resin insulation layer 67. Thus, a base material 69 is prepared.

Figure 4B:
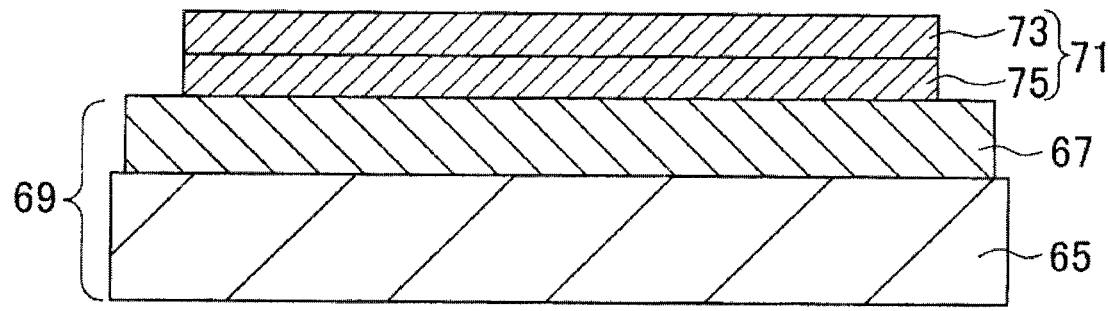

As shown in FIG. 4B, a multilayer metal sheet body 71 is laid over an upper surface of the base material 69. The multilayer metal sheet body 71 is formed by bringing two copper foils 73 and 75 into close contact with each other in a removable manner.

Figure 4C:
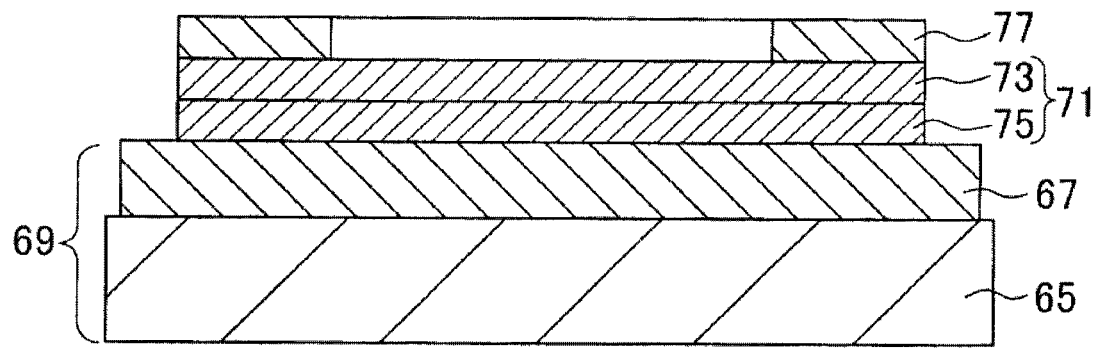

As shown in FIG. 4C, a plating resist 77 conforming to a shape of the lower metal conductor portion 53 is formed over an upper surface of the multilayer metal sheet body 71 in order to form the lower metal conductor portion 53. Specifically, a dry film for forming the plating resist 77 is laminated over the upper surface of the multilayer metal sheet body 71. The dry film is subjected to exposure and development, thereby forming the plating resist 77.

Figure 4D:
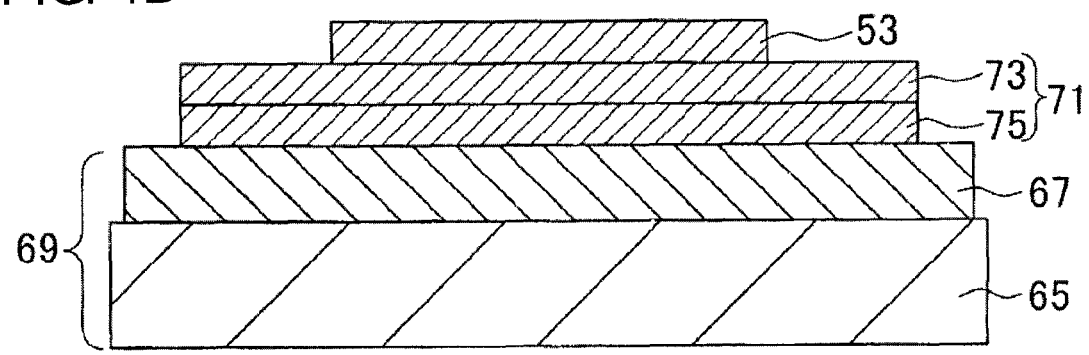

As shown in FIG. 4D, electrolytic copper plating is selectively performed while the plating resist 77 is formed, to thus form the lower metal conductor portion 53 on the multilayer metal sheet body 71. Subsequently, the plating resist 77 is peeled.

Figure 4E:
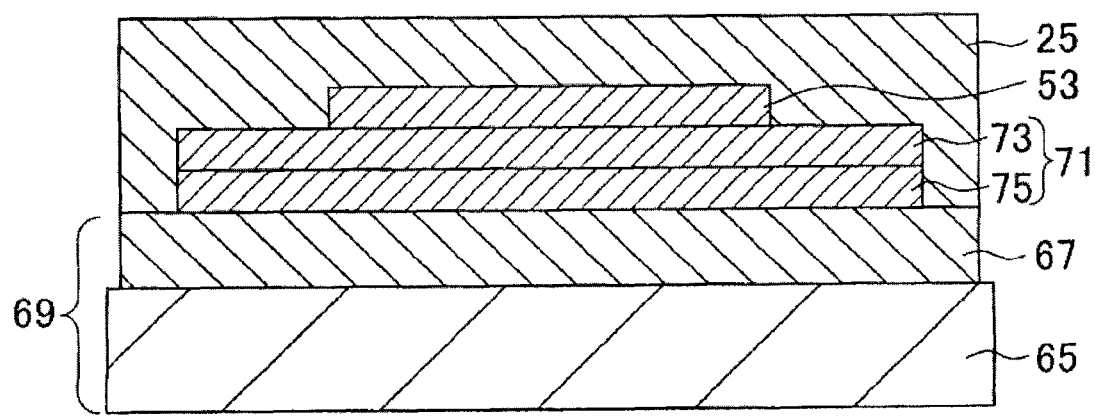

As shown in FIG. 4E, the sheet-like resin insulation layer 25 is arranged so as to wrap the multilayer metal sheet body 71 on which the lower metal conductor portion 53 is formed. The resin insulation layer 25 is then brought into contact with the lower metal conductor portion 53 and the multilayer metal sheet body 71.

Figure 5A:
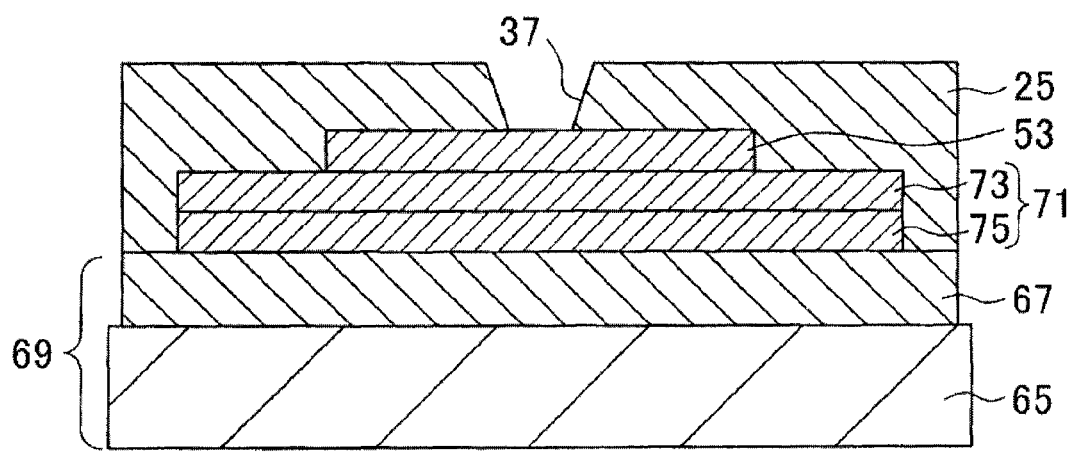
FIGS. 5A, 5B, and 5C are explanatory views showing procedures of the method for manufacturing an embodied electronic component mount wiring board while the respective members are broken in their thicknesswise direction.

As shown in FIG. 5A, the via holes 37 are formed at predetermined positions of an upper portion of the lower metal conductor portion 53 in the resin insulation layer 25 by means of laser beam machining involving use of, for instance, excimer laser, UV laser, and $CO_2$ laser. Next, a smear is eliminated from the inside of each of the via holes 37 by use of an etchant, like a permanganic acid potassium salt solution or $O_2$ plasma laser.

Figure 5B:
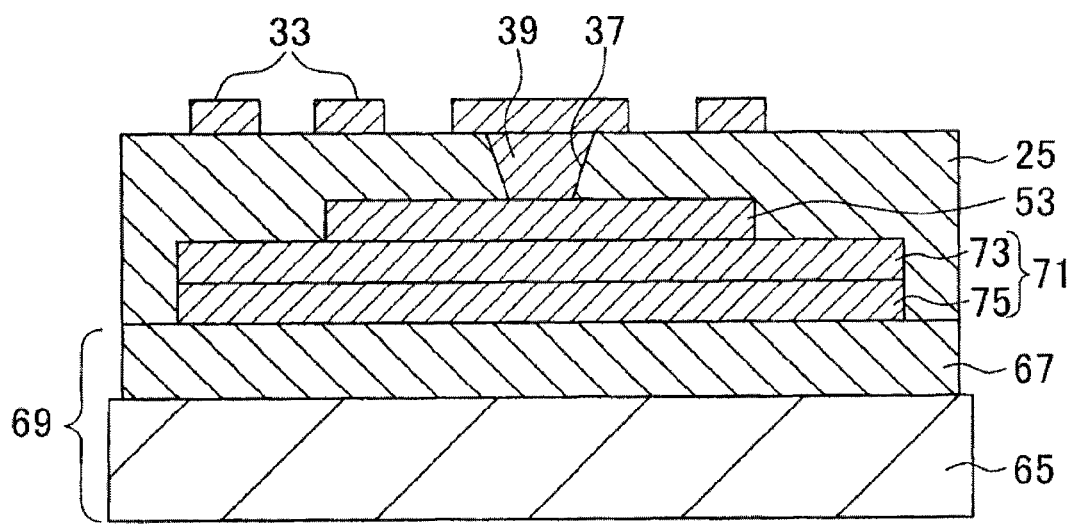

As shown in FIG. 5B, the via holes are subjected to electroless copper plating or electrolytic copper plating according to a hitherto-known technique, whereupon the via conductor 39 is formed in each of the via holes 37. Further, the board is etched by means of a known technique (e.g., a semi-additive technique), whereby the conductor layer 33 is formed in the form of a pattern over the resin insulation layer 25.

Figure 5C:
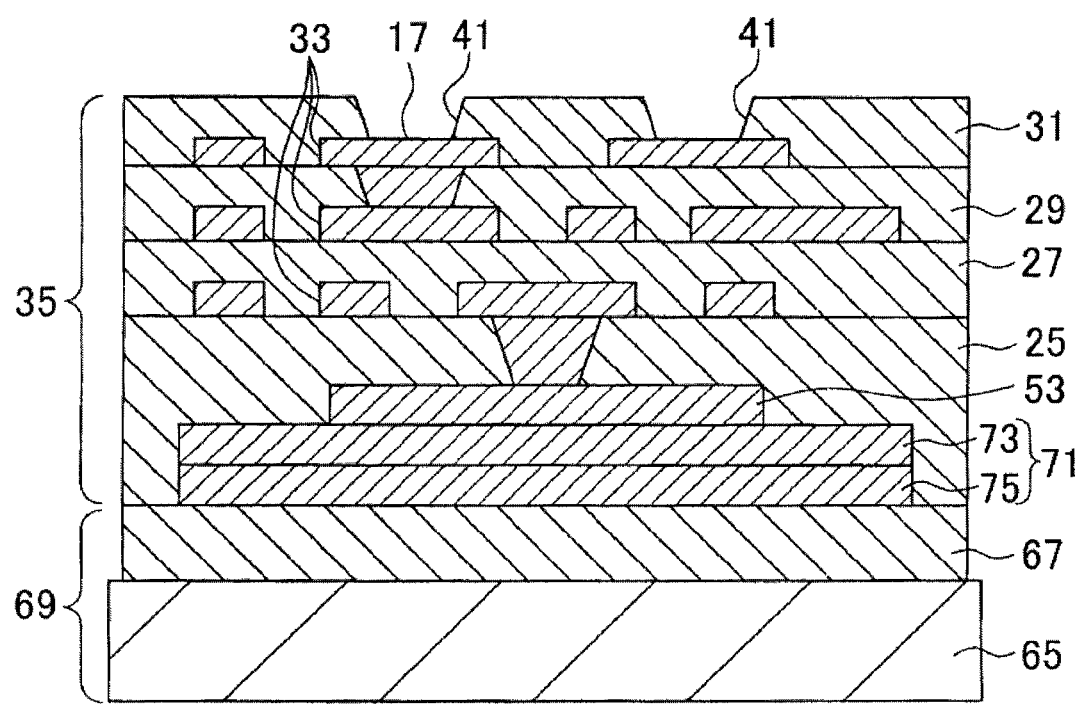

As shown in FIG. 5C, the other resin insulation layers 27, 29, and 31 and the conductor layer 33 are also sequentially formed by means of the same technique as that employed to form the resin insulation layer 25 and the conductor layer 33. The plurality of surface openings 41 are formed in the outermost resin insulation layer 31 by means of laser beam machining. Next, a smear is eliminated from each of the surface openings 41 by use of a permanganic acid potassium salt solution or $O_2$ plasma laser.

Next, an upper surface of the resin insulation layer 31 is subjected to electroless copper plating, thereby forming a full plating layer (not shown) that covers interiors of the surface openings 41 of the resin insulation layer 31 and the upper surface of the resin insulation layer 31. Plating resist (not shown), like the plating resist having the openings formed at positions corresponding to the capacitor terminal pads 47, is formed over the upper surface of the wire layered block 35.

Figure 6A:
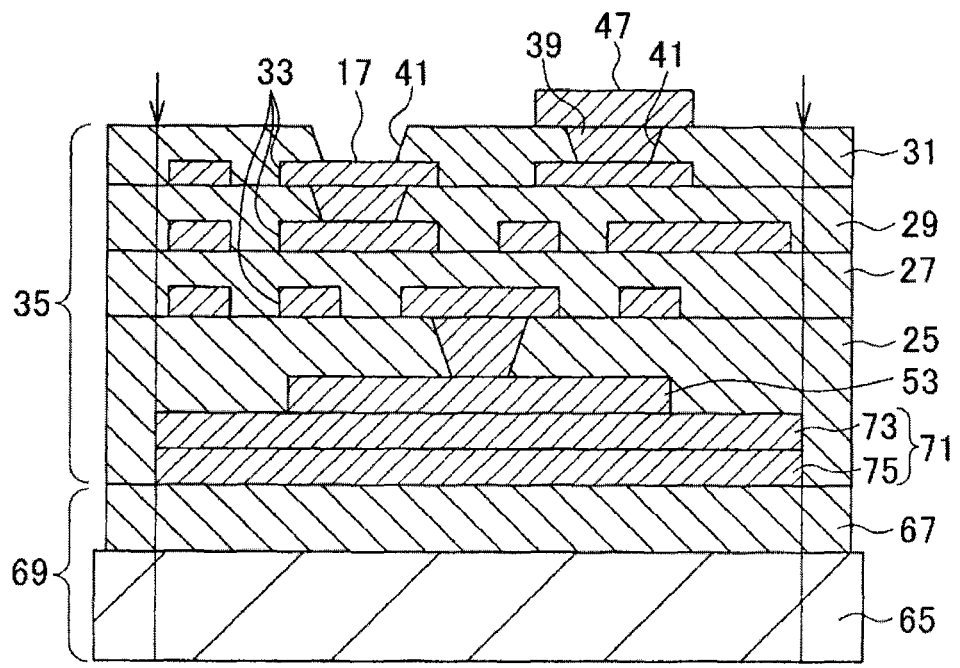
FIGS. 6A and 6B are explanatory views showing procedures of the method for manufacturing an embodied electronic component mount wiring board while the respective members are broken in their thicknesswise direction.

The surface of the board over which the plating resist is formed is then subjected to selective pattern plating. Thereby, as shown in FIG. 6A, the via conductors 39 are formed within at least some of the plurality of surface openings 41, and the capacitor terminal pads 47 are formed on the respective via conductors 39. The pads are patterned by means of the semi-additive technique, thereby eliminating the full plating layer with the via conductors 39 and the capacitor terminal pads 47 left.

The wire layered block 35 is then cut along lines designated by arrows through use of a dicing machine (not shown), thereby eliminating surrounding areas of the wire layered block 35.

Figure 6B:
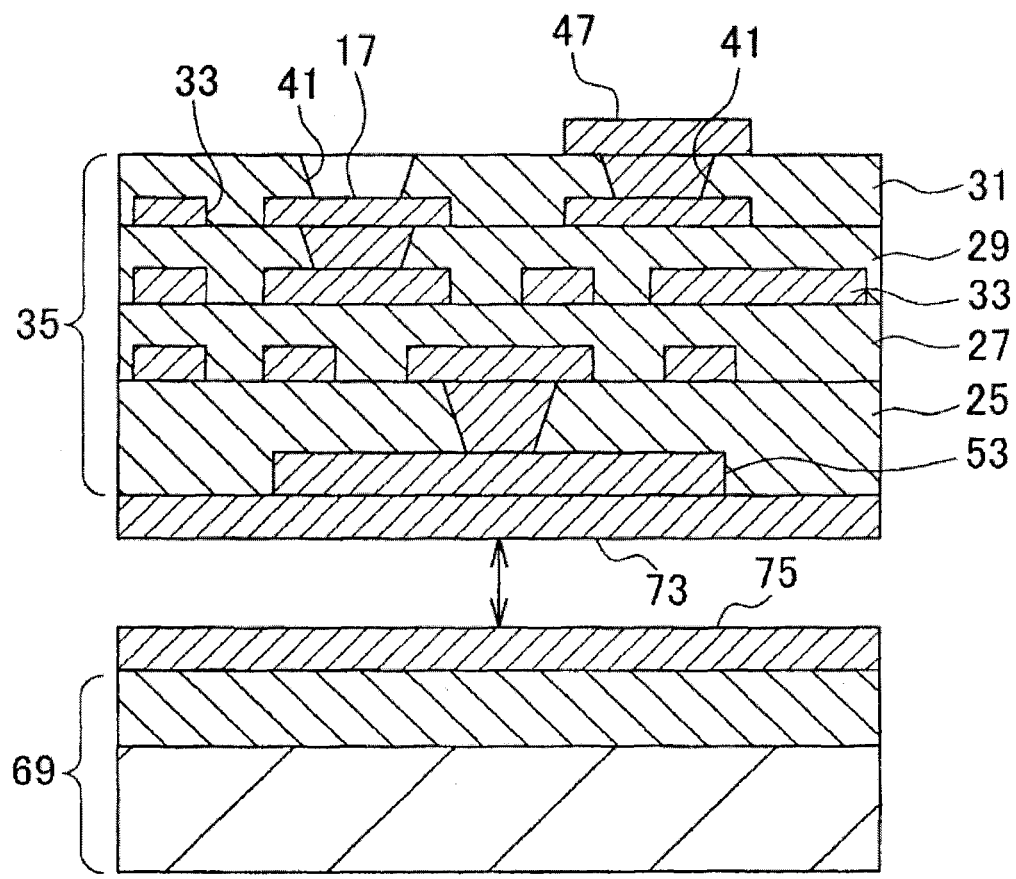

As shown in FIG. 6B, the pair of pieces of copper foil 73 and 75 of the multilayer metal sheet body 71 are peeled off from each other along an interface, thereby removing the base material 69 from the wire layered block 35. Thus, the copper foil 73 is exposed.

Figure 7A:
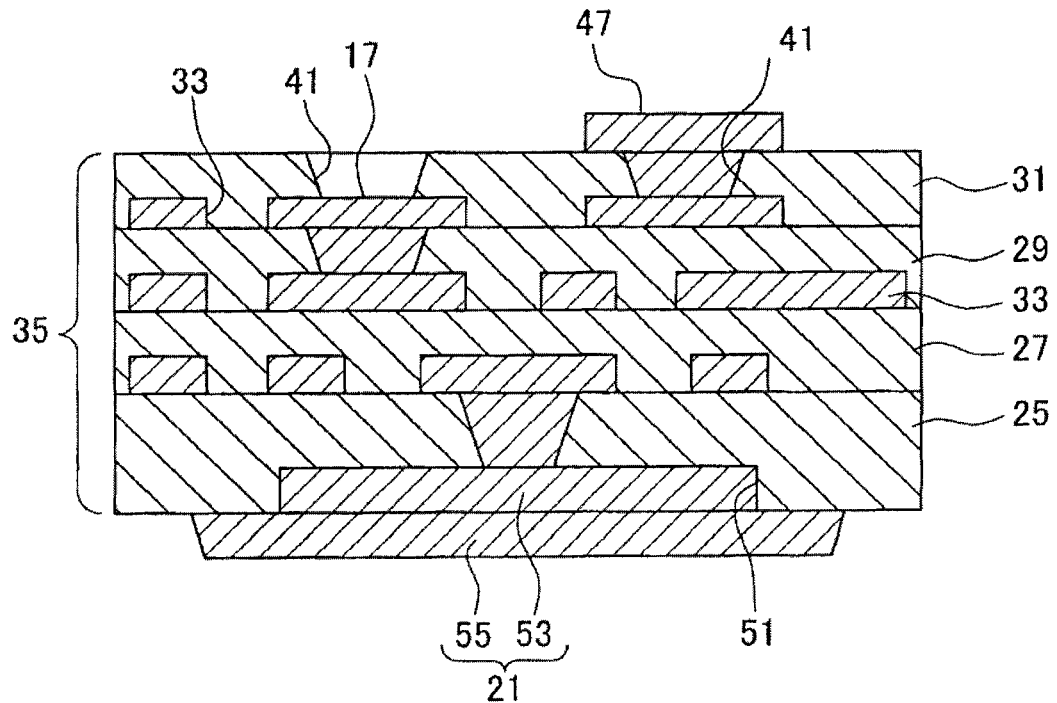
FIGS. 7A and 7B are explanatory views showing procedures of the method for manufacturing an embodied electronic component mount wiring board while the respective members are broken in their thicknesswise direction.

As shown in FIG. 7A, the copper foil 73 is partially etched away on the lower surface side (the second principal surface side) of the wire layered block 35 with the lower metal conductor portion 53 being left, thereby forming the upper metal conductor portion 55.

Figure 7B:
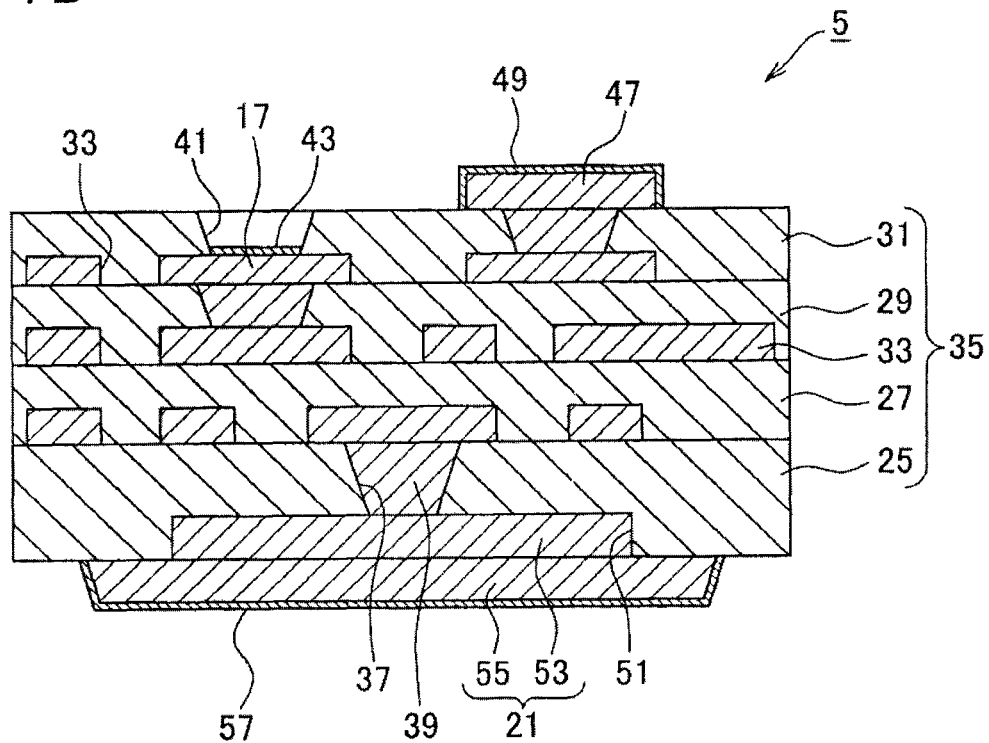

As shown in FIG. 7B, a surface of each of the chip mount terminal pads 17, a surface of each of the capacitor terminal pads 47, and a surface of each of the mother board terminal pads 21 are subjected to electroless nickel plating and electroless gold plating in this sequence, thereby forming the nickel-gold plating layers 43, 49, and 57. Thus, the multilayer board 5 is completed.

Process for Forming Solder Bumps

Illustrative explanations are now given for a process of forming the solder bumps 9 on the respective chip mount terminal pads 17.

Figure 8A:
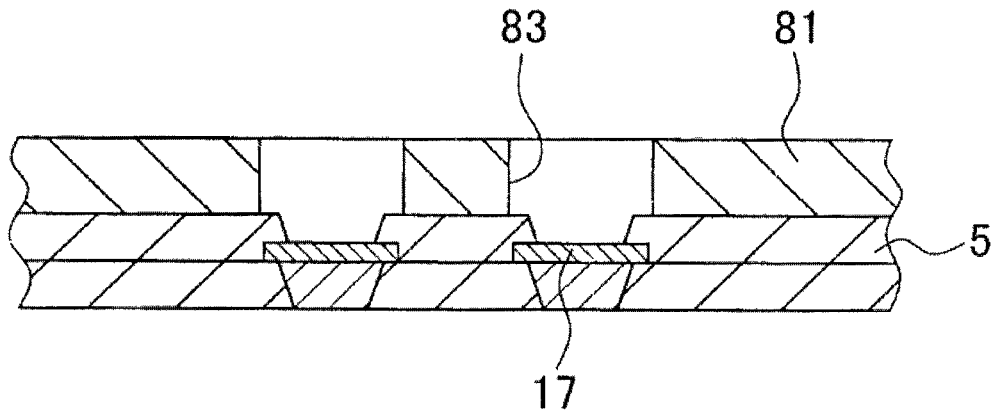
FIGS. 8A, 8B, 8C, and 8D are explanatory views showing procedures employed during the formation of solder bumps while the embodied electronic component mount wiring board is broken in its thicknesswisewise direction.

As can be seen from the enlarged view at a principal portion shown in FIG. 8A, a solder print mask 81 is first placed on the multilayer board 5 manufactured under the previously-described manufacturing method. Openings 83 whose shape is similar to a planar shape of each of the chip mount terminal pads 17 are formed at positions on the solder print mask 81 corresponding to the respective chip mount terminal pads 17.

Figure 8B:
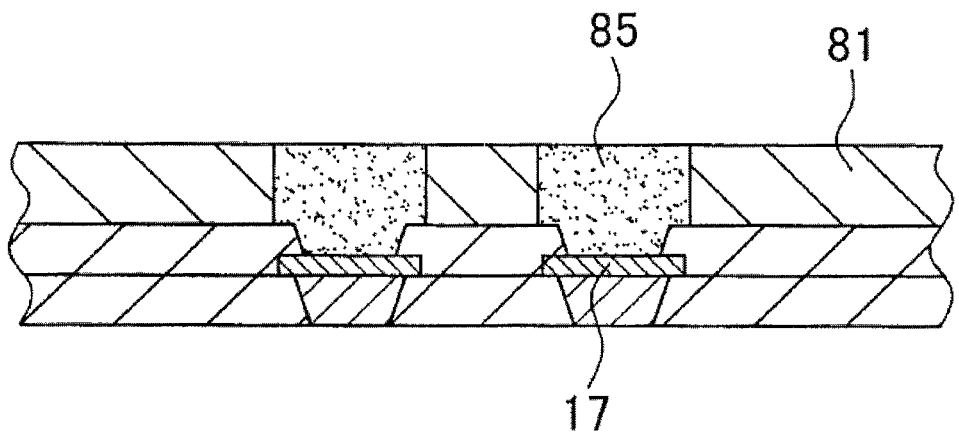

As shown in FIG. 8B, the board is subjected to known printing by use of the solder print mask 81 and a paste-like bonding material 85 (e.g., a bonding paste) that is a print material, thereby filling the respective openings 83 of the solder print mask 81 with the bonding paste 85.

The bonding paste 85 used in the present embodiment includes various components (e.g., an organic solvent, an additive, and the like), such as those to be pasted, other than solder and the thermosetting resin. For instance, 85 percent by weight of Sn—Bi-based solder, 10 percent by weight of epoxy resin that is a thermosetting resin, and 5 percent by weight of other components can be adopted as a composition of the bonding paste.

The solid components (i.e., solder and a thermosetting resin) acquired after bonding assume the following ratio of solder to thermosetting resin. Namely, solder accounts for, for instance, 85 percent by weight within a range from 50 percent by weight to 95 percent by weight, and a thermosetting resin accounts for, for instance, 15 percent by weight within a range from 5 percent by weight to 50 percent by weight.

Figure 8C:
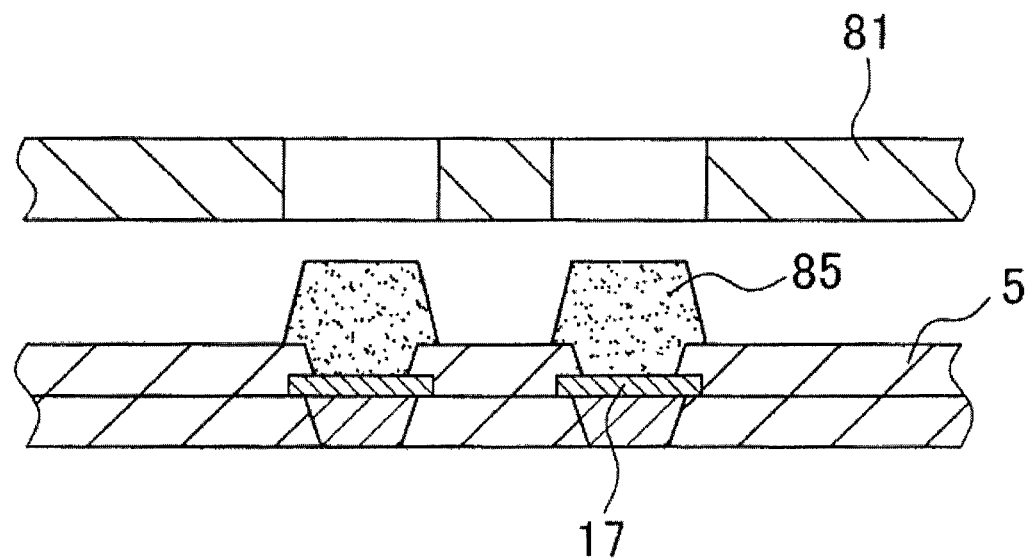

As shown in FIG. 8C, the solder print mask 81 is peeled off from the multilayer board 5. The bonding paste 85 comes to be arranged in the form of a layer on the respective chip mount terminal pads 17.

Figure 8D:
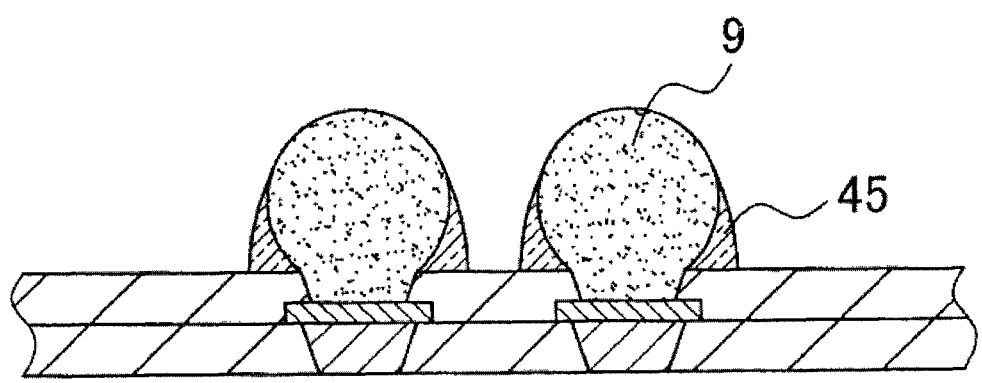

As shown in FIG. 8D, the bonding paste 85 is heated and subsequently cooled, thereby forming the solder bumps 9 and the electric insulation surface layer 45.

More specifically, there can be employed a heating profile that is set on the basis of for instance, a heating temperature ranging from 140 degrees centigrade to 230 degrees centigrade and a heating time ranging from 5 to 300 seconds. For instance, a heating temperature of about 180 degrees centigrade and a heating time of 180 seconds are set in specific embodiments. The heating temperature is set so as to become higher than the fusing temperature of solder and the glass transition temperature of the thermosetting resin.

Accordingly, in the present embodiment, the epoxy resin in the bonding paste 85 becomes softened when heated to a temperature that is higher than the glass transition temperature (e.g., 120 degrees centigrade).

Subsequently, when heated to a temperature at which solder becomes fused (e.g., 140 degrees centigrade), the solder becomes fused in the softened epoxy resin, to thus become integrated. The thus-integrated solder assumes the shape of the solder bumps 9. Simultaneously, the surface of a lower half of each of the solder bumps 9 is coated with the epoxy resin. The epoxy resin is cured in that state along with a further increase in temperature, to thus form the electric insulation surface layer 45.

When the temperature is lowered to a normal temperature (e.g., room temperature or a temperature below the solder solidification point), solder becomes solidified, thereby providing a junction structure in which a surface of a lower half of each of the solder bumps 9 is covered with the electric insulation surface layer 45.

The chip capacitor 11 is then mounted, and the stiffener 13 made of stainless steel is bonded, whereupon the mount wiring board 1 of the present embodiment is completed.

By reference to FIG. 9, explanations are now given for a method for manufacturing the electronic-component-mounted wiring board 1 by means of mounting the IC chip 3 on the mount wiring board 1.

Figure 9A:
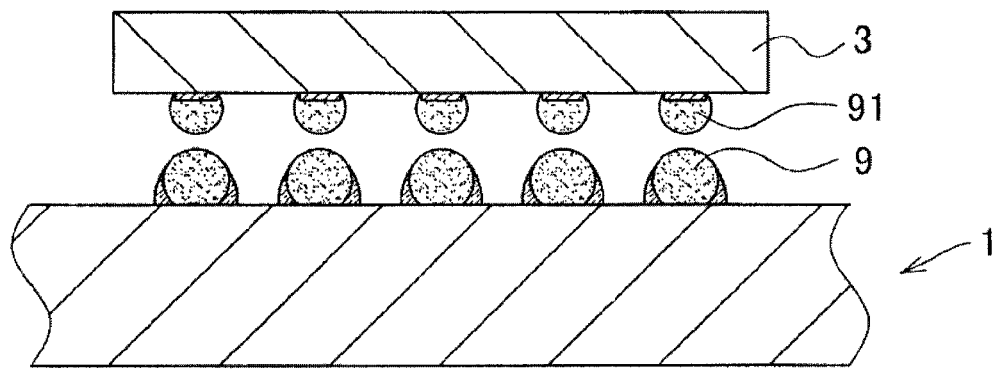
FIGS. 9A and 9B are explanatory views showing a method for manufacturing an embodied electronic-component-mounted wiring board while the wiring board is broken in its thicknesswise direction.

As shown in FIG. 9A, a method for mounting an IC chip 3 having on one side a plurality of solder bumps 91 to the mount wiring board 1 by means of flip-chip bonding is now described.

The solder bumps 91 are formed on the IC chip 3 in the same layout in which the solder bumps 9 of the mount wiring board 1 are placed. Solder that is higher than the solder bumps 9 of the mount wiring board in terms of a fusing point is used as solder of the solder bumps 91 of the IC chip 3.

As illustrated in the drawings, the IC chip 3 is brought, from above, close to the mount wiring board 1. More specifically, extremities of the solder bumps 9 of the mount wiring board 1 and extremities of the solder bumps 91 of the IC chip 3 are brought into close proximity to each other or in contact with each other.

The board is heated, for instance, to 140 degrees centigrade, thereby re-fusing only the solder bumps 9 of the mount wiring board 1. Since the electric insulation surface layer 45 assumes a post-cure structure, the electric insulation surface layer 45 will not be softened even when the solder bumps 9 are fused again.

Figure 9B:
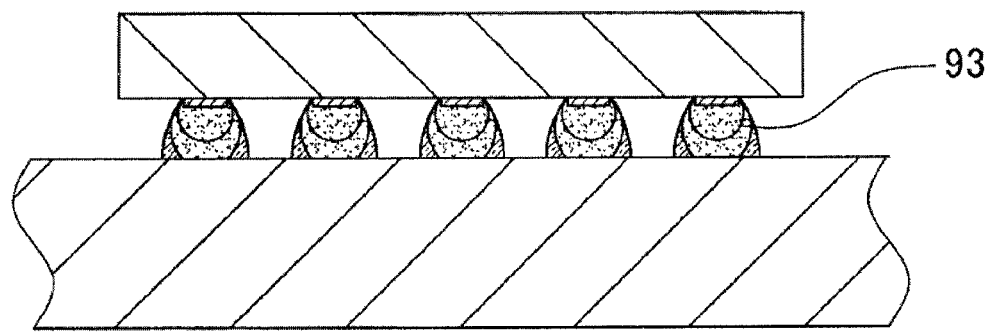

As a result of the solder bumps 9 being re-fused, the solder making up the solder bumps 9 spreads so as to enclose surrounding areas of the respective solder bumps 91 of the IC chip 3 by means of surface tension, as shown in FIG. 9B, to thus become integrated with the solder bumps 9.

Subsequently, single solder bumps 93, each of which is an integration of the mutually-opposing solder bumps 9 and 91, are made by cooling. The IC chip 3 is bonded to the mount wiring board 1 by means of the solder bumps 93.

In the present embodiment, the bonding material paste 85 including both solder and an electrical insulation material made of a resin is placed on each of the chip mount terminal pads 17. The bonding material paste 85 is heated, to thus fuse the solder and soften the electrical insulation material. Subsequently, the solder is solidified, to thus form the solder bumps 9. Further, the electrical insulation material is cured on the surface of each of the respective solder bumps 9 and the surface of the multilayer board 5 located around the respective solder bumps 9, thereby forming the electrical insulation surface layer 45.

Specifically, in the present embodiment, the electric insulation surface layer 45 is formed around each of the solder bumps 9. Hence, when the solder is fused again during operation for mounting the IC chip 3 on the mount wiring board 1 with the solder bumps 9 having the foregoing structure, there will be yielded an advantage of the adjacent solder bumps 9 hardly coming into connection with each other, because of the electric insulation surface layer 45 being formed around each of the solder bumps 9.

In particular, when the volume of solder is large or when a pad pitch is small, a contact will be likely to arise between the solder bumps. In the present embodiment, there is yielded an advantage of the ability to minimize or prevent occurrence of a connection between the solder bumps even in such a case.

In the present embodiment, since the electric insulation surface layer 45 is formed over the surface of the lower half of each of the solder bumps 9, there is yielded an advantage that the IC chip 3 can preferably be bonded without being intervened by the electric insulation surface layer 45 when the solder is re-fused to bond the IC chip 3. Since warpage of the multilayer board 5 to which the stiffener 13 is bonded has already been corrected, it is possible to minimize or prevent, in an effective manner, occurrence of a connection between the solder bumps, which would otherwise occur during re-fusing of solder.

Further, in the present embodiment, the bonding material paste 85 can adopt a configuration in which solder accounts for, as a solid component, 50 percent by weight to 95 percent by weight and in which an electric insulation material accounts for 5 percent by weight to 50 percent by weight. Hence, it is possible to adopt a structure in which a surrounding area of each of the solder bumps can easily be surrounded by the electric insulation material.

The present invention is not limited to the above-described embodiments, and can assume various forms so long as they fall within a technical scope of the present invention.

Figure 10:
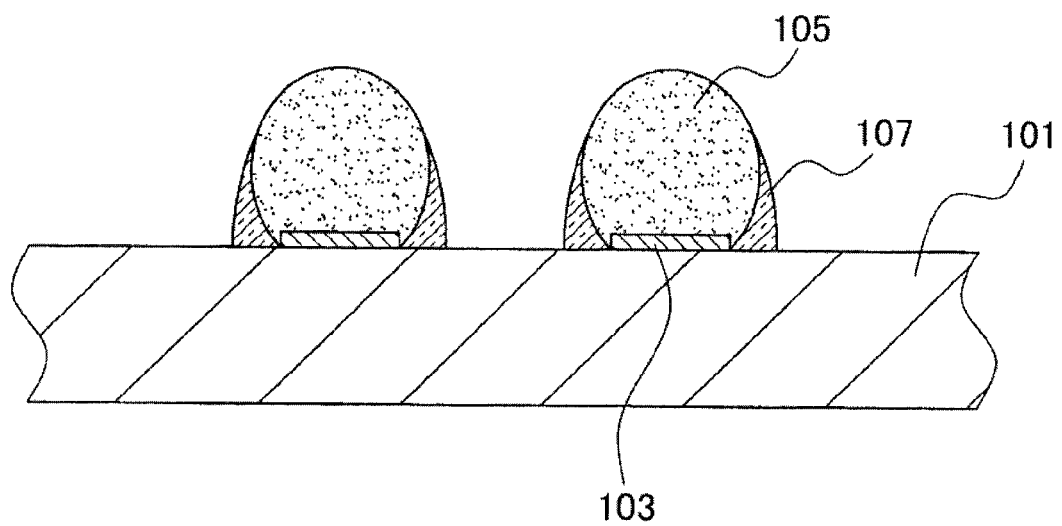
FIG. 10 is an explanatory view showing another method for manufacturing an embodied electronic component mount wiring board while the wiring board is broken in its thicknesswise direction.

For instance, the present invention can be adopted regardless of whether or not a solder resist exists on the surface of the electronic component mount wiring board. Specifically, as shown in FIG. 10, protruding terminal pads 103 are formed on a surface of a resin insulation layer 101 making up the multilayer board. A solder bump 105 can also be formed on a surface of each of the terminal pads 103, and an electric insulation surface layer 107 can also be formed so as to cover a lower half of each of the solder bumps 105. In this case, an entire surface of each of the terminal pads 103 including its upper and side surfaces is bonded to the corresponding solder bump 105. Hence, there is yielded an advantage of a highly reliable connection being established between the solder bumps 105 and an electronic component to be mounted later.

Figure 11A:
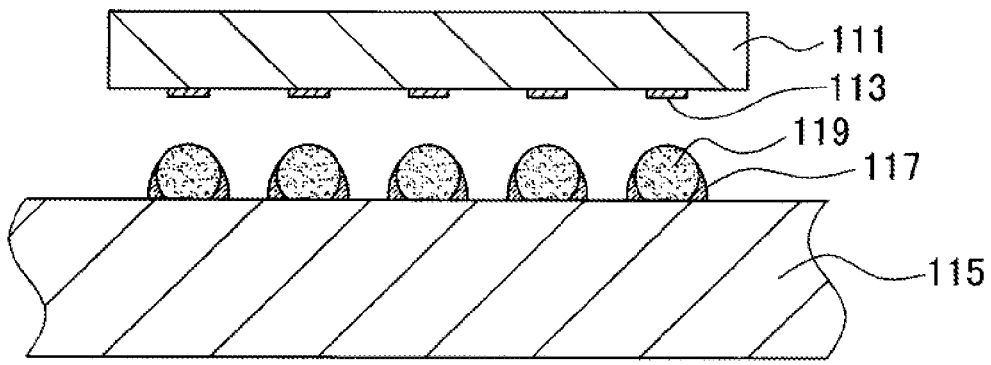
FIGS. 11A and 11B are an explanatory view showing another method for manufacturing an embodied electronic-component-mounted wiring board while the wiring board is broken in its thicknesswise direction.
Figure 11B:
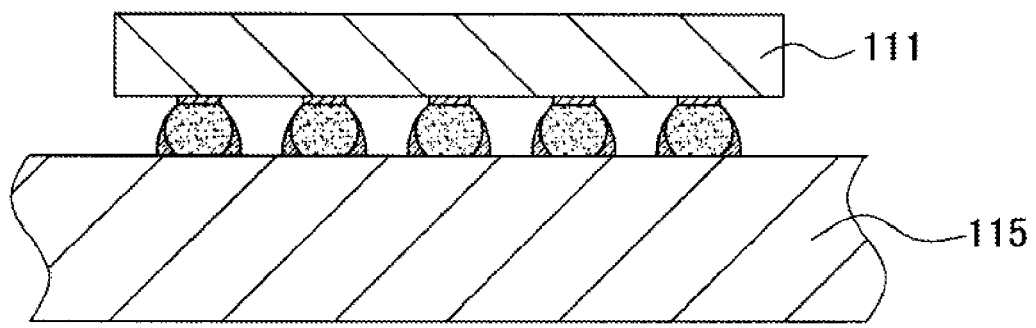
Figure 12A:
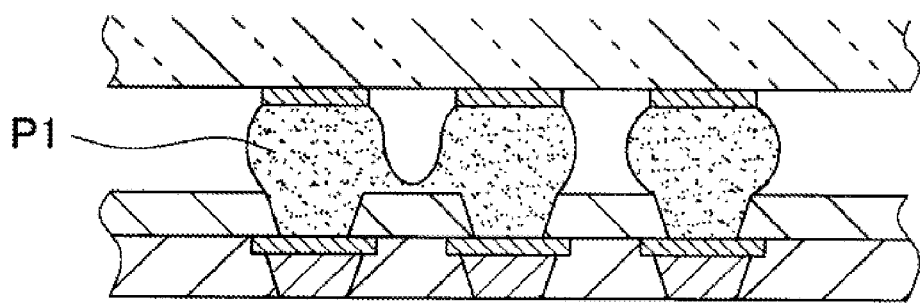
FIGS. 12A and 12B are explanatory view of the related art.
Figure 12B:
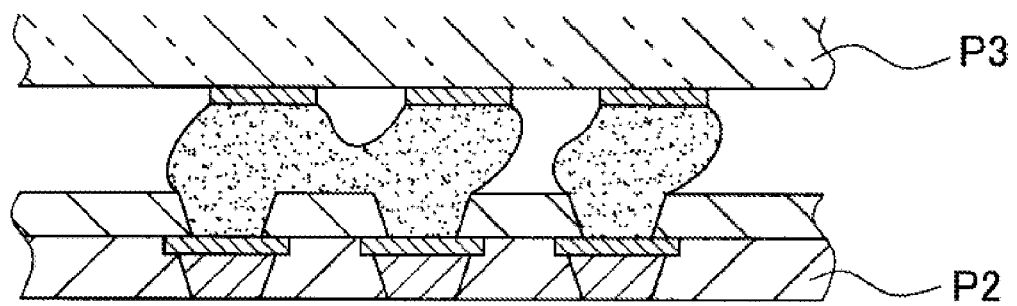

Although flip-chip bonding of an IC chip has been described in connection with the above-described embodiment, when no solder bumps are formed on an electronic component 111 (e.g., an IC chip) to be mounted, as shown in FIGS. 11A and 11B, solder bumps 119, each of which has an electric insulation surface layer 117, on an electronic component mount wiring board 115 can also be bonded directly to respective pads 113, or the like, formed on a surface of the electronic component 111.

The embodiment has described the method for re-fusing only the solder bumps of the electronic component mount wiring board, to thus bond the IC chip to the wiring board. However, there can also be adopted a method for re-fusing both solder bumps of the electronic component mount wiring board and solder bumps of the IC chip, to thus be integrated and bond the IC chip.

The embodiment has described the wiring board having the stiffener made of stainless steel. However, any material may be used for the stiffener so long as the material is chosen with consideration of a coefficient of thermal expansion of a multilayer board and a required rigidity. For instance, it is desirable to form the stiffener from a highly rigid metallic material and a ceramic material. Further, for example, the stiffener can also be formed from a resin material or a composite material including an inorganic material contained in a resin material.

Although the above-described embodiment has described a wiring board having a CP and a stiffener, the present invention can also be applied to a wiring board not having the CP or the stiffener.

Other embodiments of the present invention show that working effects similar to those yielded in for the above-described embodiment were also yielded even when the solder assumes the lower limit value (e.g., the solder accounts for 50 percent by weight and the electric insulation material accounts for 50 percent by weight) and the upper limit value (e.g., the solder accounts for 95 percent by weight and the electric insulation material accounts for 5 percent by weight) within a numerical range of components of the bonding material.

What is claimed is:

1. A method for manufacturing a wiring board for mounting an electronic component by means of solder bumps formed on respective terminal pads of a multilayer board, which includes a conductor layer and a resin insulation layer layered one on top of the other, the method comprising:
   putting on each of the terminal pads a bonding material that includes solder and an electric insulation material made of a resin;
   heating the bonding material to fuse the solder and soften the electric insulation material;
   solidifying the solder to form the solder bumps; and
   curing the electric insulation material on a surface of each of the solder bumps and a surface of the multilayer board located around each of the solder bumps to form an electric insulation surface layer.

2. The method for manufacturing a wiring board for mounting an electronic component according to claim 1, wherein the bonding material is a paste, and the bonding material after solidifying the solder includes 50 percent by weight to 95 percent by weight of the solder and 5 percent by weight to 50 percent by weight of the electric insulation material.

3. The method for manufacturing a wiring board for mounting an electronic component according to claim 1, wherein the electric insulation material is formed from a thermosetting resin, and a glass transition temperature of the thermosetting resin is a fusing point of the solder or less.

4. A method for manufacturing an electronic-component-mounted wiring board from a wiring board for mounting an electronic component comprising a multilayer board made up of a conductor layer and a resin insulation layer layered one on top of the other, terminal pads formed on the multilayer board, and solder bumps formed on the terminal pads, wherein the electronic component is mounted by means of the solder bumps, and an electric insulation surface layer made of an electric insulation material is formed on each of the solder bumps from a surface of the solder bumps to a surface of the multilayer board located around the solder bumps, the method comprising:
   heating the solder bumps while terminals of the electronic component are held in contact with or in close proximity to the solder bumps to fuse the solder bumps; and
   cooling the solder bumps to solidify and bond the solder bumps to the terminals of the electronic component, thereby mounting the electronic component to the wiring board for mounting an electronic component.

* * * * *